United States Patent [19]
Behrent

[11] Patent Number: 5,774,375
[45] Date of Patent: Jun. 30, 1998

[54] METHOD AND APPARATUS FOR THE CORRECTION OF SIGNAL-PAIRS

[75] Inventor: Hermann Behrent, Kuddewörde, Germany

[73] Assignee: SICAN Gesellschaft für Silizium-Anwendungen und CAD/CAT Niedersachsen mbH, Hanover, Germany

[21] Appl. No.: 793,673

[22] PCT Filed: Aug. 24, 1995

[86] PCT No.: PCT/DE95/01125

§ 371 Date: Feb. 27, 1997

§ 102(e) Date: Feb. 27, 1997

[87] PCT Pub. No.: WO96/07235

PCT Pub. Date: Mar. 7, 1996

[30] Foreign Application Priority Data

Aug. 29, 1994 [DE] Germany ............................ 44 30 679.2

[51] Int. Cl.$^6$ .................................................. G01G 25/00
[52] U.S. Cl. ................ 364/571.01; 455/304; 375/349
[58] Field of Search .................................. 375/329–333, 375/344, 349, 261–265; 329/304, 306, 307, 309; 331/25; 342/194; 455/303–306; 364/571.01–571.08

[56] References Cited

U.S. PATENT DOCUMENTS

| | | | |
|---|---|---|---|
| 4,475,088 | 10/1984 | Beard | 331/25 |
| 5,165,051 | 11/1992 | Kumar | 324/79 D |
| 5,230,099 | 7/1993 | Loper | 455/324 |
| 5,371,481 | 12/1994 | Tittanen et al. | 332/103 |
| 5,590,158 | 12/1996 | Yamaguchi et al. | 375/331 |

FOREIGN PATENT DOCUMENTS

| | | |
|---|---|---|
| 343 273 | of 0000 | European Pat. Off. . |
| 473 373 | 3/1992 | European Pat. Off. . |
| 598 277 | 3/1994 | European Pat. Off. . |
| 595 277 | 5/1994 | European Pat. Off. . |
| 595 278 | 5/1994 | European Pat. Off. . |
| 3938 643 | 5/1990 | Germany . |

OTHER PUBLICATIONS

I.O. Kerner, "Bester Kegelschnitt durch n Pinkte", ZAMM 59, pp. 396–397, 1979.

*Primary Examiner*—James P. Trammell
*Attorney, Agent, or Firm*—Flehr Hohbach Test Albritton & Herbert LLP

[57] ABSTRACT

Method and apparatus for correcting signal-pairs from vectors that represent inphase signals (I) and quadrature signals (Q). The values for correction of the amplitude error $\alpha$ and phase error $\delta$ are determined by calculating the most probable correction values of offsets from a center point of the signal-pairs using signal probes from the stream of the inphase and quadrature signals. The amplitude error $\alpha$ and phase error $\delta$ are calculated corrected as a function of the signal probes only after a preceding correction of the center point.

11 Claims, 1 Drawing Sheet

Figures

METHOD AND APPARATUS FOR THE CORRECTION OF SIGNAL-PAIRS

This application is a 371 of PCJ/DE95/01125 filed Aug. 24, 1995.

The invention relates to a method and an apparatus for the correction of signalpairs, comprising inphase (I) and quadrature signals (Q) which are representable as vectors.

STATE OF THE ART

Analog or digital perpendicular signal-pairs in particular are applicated, where two signals are transferred at the same time by means of only one carrier-signal, for instance at the television with the modulation of the carrier for the color signal at the PAL-standard, or at the vector modulation, but also, where the signal spectra are converted into another frequency range, such as in radio signals, the processing of radar signals and the sonometrie. The method of the invention and the apparatus thereby advantageously can be utilized for the correction of angular modulated signals.

Due to non ideal components having a tolerance linear distortions of the base band signals arise, among other things through mismatch of the amplitudes and phases, the offset of the DC-signal and the frequency, as well as through non linear distortions caused by crosstalk and intermodulation.

Correction devices take remedial measures, which are detecting systematic and statistical errors of the perpendicular pair of signals by means of suitable detectors and generating correction signals thereof, in order to adjust the errors through feedback.

In EP 473 373 a system for calibrating a homodyne receivers is described, in order to adjust the error of the phase in the HF-front-end. The described system has the disadvantage, that the operation is interrupted in intervals for the injection of an auxiliary carrier and that the reference signal distinguishes from the received signal, so that only an approximated correction of the phase is taking place.

In EP 343 273 in a process following the HF-front-end, the whole linear distortions named above, with exception of the frequency offset, are detected and adjusted by multiple underlying feedback's. The disadvantage of this procedure is the concatenation of the control variables and the need of control permanently increased therewith, as well as the risk of instability associated therewith. This state of the art a separately and commutative, separate of each other feasible correction of the DC-offset, of the amplitude- and phase-error is to be gathered. The solution is based on a calculation of most probably values insofar, as DC-signal parts are determined for the calculation of values for correction.

In EP 595 278 the determination of the whole error values of I- and Q-signals at homodyne receivers by a calculation of most probably values is claimed, e.g. by a linear regression (see I. O. Kerner "Bester Kegelschnitt durch n Punkte" ZAMM 59, pp. 396–397, 1979). The disadvantage of the procedure is the complex calculational effort for the solution of a square matrix for five unknown parameters of an ellipsis, which is also not revealed in that patent specification.

From EP 598 277 and DE 39 38 643 a method and an apparatus for the offset correction is known. Thereby it is required that the correction of the ellipsis has taken place before.

For the correction of the offset of the center point the coordinates of the center point of two I- and Q-signals being in quadrature and displaced about the center point are determined by means of calculation of the most probably values such, that lines of centers of gravity are formed and a common intersection point will be determined. For this, a number of differences of square radii of respective two successive points are minimized and subtracted of the I- and Q-signals. The linearization and minimization of the function is also carried out according to I. O. Kerner. Such a solution is showing a comparatively great deviation of the actual centers because of the finite precision of calculating of the executive arithmetic units. In particular the rounding errors are greatly increasing with growing distortion.

In EP 595 277 the frequency-offset of the local oscillator at homodyne receivers is claimed, which causes a superimposed rotation of the vector, represented by the perpendicular pair of signals in the Cartesian I-, Q-plane, so that the probability of the top of the vector being at a defined place is regularly distributed to the circumference of the ellipse.

In U.S. Pat. No. 5,165,051 a method and an apparatus for determination of the amplitude, the phase and the frequency of a pair of signals is disclosed, comprising inphase (I) and quadrature signals (Q) being representable as vectors. By means of the method of the minimum squared errors ("Least Square Estimation"—LMS) the signal parameters are calculated from signal probes. The LMS method is a calculation of most probable values having a little calculational effort for filtering the periodical oscillations from a signal blotted out with noise. Using the calculated signal parameter of the periodical part of the signal a local oscillator is controlled, which parameter of the periodical part of the signal a local oscillator is controlled, which signal is blotted out directly with the inphase signal (I) and with the quadrature signal (Q) using a phase shift of 90 degree. So, relatively precise the carrier signal can be determined, but only future signals can be corrected. The current signal used for the calculation of the signal parameter stays unchanged. For this reason, at continuous signals the error could be small, but because of the feedback of the signal there is danger of residual oscillations of the system.

OBJECT OF THE INVENTION

Object of the invention has been showing a method and an apparatus for the correction of signal-pairs, comprising inphase (I) and quadrature signals (Q) which are representable as vectors. Thereby, the values for correction should be calculated by means of a calculation of the most probably values among utilization of signal probes from the signal stream. In order to avoid rest oscillations, the correction should not be performed with a feedback system. In the method the calculational effort should be kept as low as possible.

INVENTION

For the solution of this object the invention now provides, that after a preceding correction of the offset of the center point the error of the amplitudes $\alpha$ and the error of the phases $\delta$ is carried out. These parameters can be calculated by the matrix equation $$\begin{bmatrix} \alpha^2 \\ -2 \cdot \alpha \cdot \sin(\delta) \\ -r^2 \cdot \delta^2 \cdot \cos^2(\delta) \end{bmatrix} = \qquad (1)$$

$$\begin{bmatrix} \sum_{k=1}^{p} (Q'_k)^4 & \sum_{k=1}^{p} I'_k \cdot (Q'_k)^3 & \sum_{k=1}^{p} (Q'_k)^2 \\ \sum_{k=1}^{p} I'_k \cdot (Q'_k)^3 & \sum_{k=1}^{p} (I'_k)^2 \cdot (Q'_k)^2 & \sum_{k=1}^{p} I'_k \cdot Q'_k \\ \sum_{k=1}^{p} (Q'_k)^2 & \sum_{k=1}^{p} I'_k \cdot Q'_k & p \end{bmatrix}^{-1} \cdot$$

$$\begin{bmatrix} -\sum_{k=1}^{p} (I'_k)^2 \cdot (Q'_k)^2 \\ -\sum_{k=1}^{p} (I'_k)^3 \cdot Q'_k \\ -\sum_{k=1}^{p} (I'_k)^2 \end{bmatrix},$$

whereby at least respective three signal probes $Q'_k$ and $I'_k$ already being center point corrected are taken from the signal stream.

According to the invention the system of equations for the correction of the amplitude error a and the phase error δ is based upon an equation of a circle centered in the origin and its transformation to a function of an ellipse under retention of one of the signals I or Q as a reference signal. The minimum number of three signal probes $Q'_k$ and $I'_k$ ($n,p \geq 3$) hereby emerges from the necessity of the mathematical determination of the equation systems.

The calculational effort could be greatly minimized both by the separation and the order of the methods (first the calculation of the offset of the center point and then the calculation of the errors of the amplitudes and the phases), as well as by the reduction of the equation systems. Thereby the claimed form of the calculation of the most probably values can only be used with the separation and the order of the procedures being inventive together with the calculation of the most probably values.

For the correction of the center point several methods are conceivable. In comparison with the calculation of the parameter of the ellipse the offset of the center point has to be calculated less frequently, since the disruptive factor varies only over a longer period. Therefore, the determination of the offset of the center point has to be performed less frequently, so that an optimal solution isn't as necessary for minimizing the calculational effort, such as in the method for the calculation of the errors of the amplitudes and the phases.

The combination is particularly advantageously using a further new approach for the determination of the offset of the center point. Hereby, an equation of a circle will be transformed and linearized. The parameters of the circle are optimized in such a manner, that a resulting circle is best fitted in the crowd of sample values arranged as an ellipse. Then the offset of the center point will be calculated by the matrix equation $$\begin{bmatrix} Qm \\ Im \\ H \end{bmatrix} = \qquad (2)$$

$$\begin{bmatrix} 2\sum_{I=1}^{n} (Q_I)^2 & 2\sum_{I=1}^{n} (I_I \cdot Q_I) & -\sum_{I=1}^{n} Q_I \\ 2\sum_{I=1}^{n} (I_I \cdot Q_I) & 2\sum_{I=1}^{n} (I_I)^2 & -\sum_{I=1}^{n} I_I \\ -2\sum_{I=1}^{n} Q_I & -2\sum_{I=1}^{n} I_I & n \end{bmatrix}^{-1} \cdot$$

$$\begin{bmatrix} -\sum_{I=1}^{n} [(Q_I)^3 + (I_I)^2 \cdot Q_I] \\ -\sum_{I=1}^{n} [I_I \cdot (Q_I)^2 + (I_I)^3] \\ \sum_{I=1}^{n} [(Q_I)^2 + (I_I)^2] \end{bmatrix}.$$

using signal probes $I_J$, from the uncorrected signal stream of the inphase signal (I) and using signal probes $Q_J$, from the uncorrected signal stream of the quadrature signal (Q). By using this 3×3 equation system the calculational effort can be considerably minimized.

Thereby, that the offset of the center point is compensated already before the errors of the amplitudes/phases, the order of magnitude of the values is considerably smaller and is always situated in a predictable range. The bit width and the expenditure for the arithmetic units involved can be held lower by this having an equal precision. Besides the resulting signal quality is essentially improved.

Compared to the methods described in EP 598 277, in which the ellipse is tipped over first and is corrected to a circle subsequently, through the invention a distinctive improvement of the quality could be achieved. The methods basically differ from each other to the effect, that in the invention the calculation of most probably values is not used for the determination of the point of intersection, but for the calculation of the coefficients of an optimal adapted circle.

The technical implementation of the apparatus according to claim is defined by the system of equations. The construction of an concrete apparatus according to the claims 5 to 8 is possible easily for the man skilled in the art by means of a digital signal processor or an integrated circuit specialized for the applicant (ASIC).

DETAILED DESCRIPTION OF THE PREFERRED EMBODIMENT

In the following the invention will be illustrated in details by means of the figures.

Figure 1:
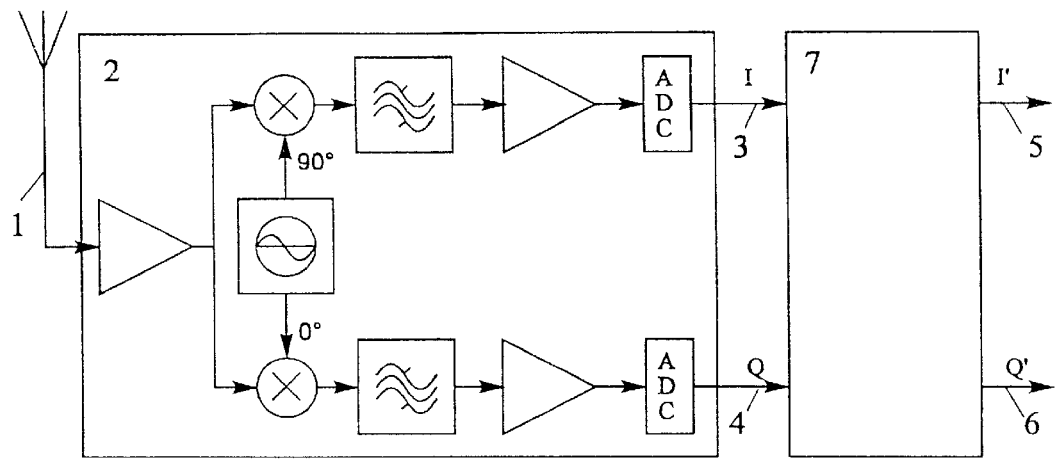
FIG. 1 shows in form of a circuit block diagram the generation of the distorted I- and Q-signals (3,4) e.g. by a HF-front-end-module (2) of a homodyne receiver from the input signal (1) and an apparatus for the correction (7) with the corrected signals (5,6), I" and Q".

In the FIG. 1 as an example a homodyne receiver (2) is shown. The input signal (1) arriving from an antenna is amplified and blot out in two mixers with the perpendicular pair of signals of a local oscillator. The frequency of oscillation thereby is located in the spectrum to be received. The undesired results of the mixed signals, arising in the low frequency range, are separated through filters. The invention is based upon the realization, that the perpendicular low-frequency pair of signals (3,4) such generated is represented by a rotating vector in the Cartesian I-, Q-plane. With a pure angular modulation the top of the vector of the undistorted and undisturbed pair of signals are lying on a circle, whose center is identical to the origin of the Cartesian I-, Q-plane. By the linear distortions described before the center point of the circle is displaced from the origin and the circle is distorted to an ellipse.

Figure 2:
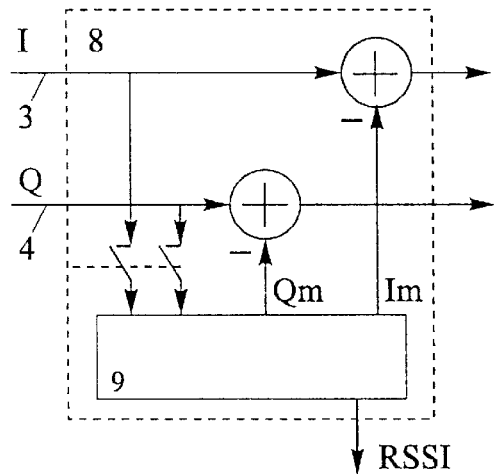
FIG. 2 shows as a signal flow chart the correction of the DC-offset in universally valid form with the arithmetic unit (9) for the determination of the center point Qm and Im.

In the FIG. 2 the signal flow for the removal of the distortion caused by the DC-offset is shown. The DC-offset is represented by a displacement of the center point of the rotating vector in the Cartesian I-, Q-plane, so that for the correction of the offset the center of this elliptical I-, Q-signal has to be determined. The invention provides determining these center point by calculation of most probably values in the arithmetic unit (9) for a circle instead of an ellipse from samples of the measured I- and Q-signals. This method is very exact in particular then, if through the frequency-offset of the local oscillator mentioned at the beginning a blot out rotation of the vector is brought in and by this the probability of the top of the vector being at a defined place on the circumference of the ellipse is regularly distributed. By subtraction of the center point from the measured I- and Q-signal (3,4), the distorting the DC-offset will be removed.

Figure 3:
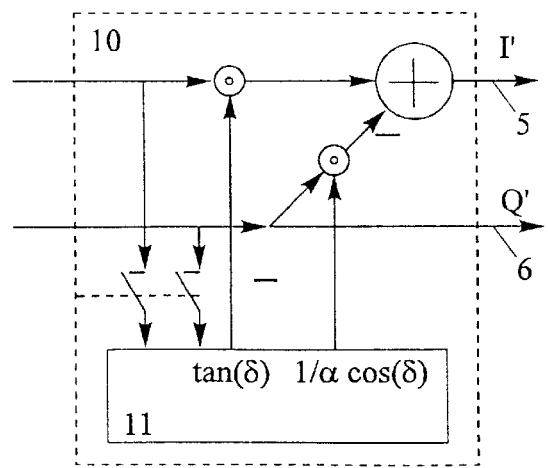
FIG. 3 shows as a signal flow chart the correction of the ellipticity in universally valid form with the arithmetic unit (11) for the determination of the coefficients for the correction.

In the FIG. 3 the signal flow for the correction of the ellipticity is shown. The parameters of the ellipse are determined from samples of the I- and Q-signal freed from the DC-offset by calculation of most probably values in the arithmetic unit (11) and the elliptical distortion is canceled. With it, the linear corrected I- and Q-signals (5,6) are prepared for further processing.

The methods for the correction of the DC-offset and the elliptical distortion using the method of the calculation of most probably values can be performed independently from each other, because the determination of the DC-offset is valid by the assumption of an optimal fitted circle. Thereby, that first the removvment of the DC-offset and subsequently the correction of the ellipticity is taken place, the calculational effort can be reduced. If the whole values for correction are determined using only one calculation of most probably values by application of the linear regression, a system of equations having a 5×5-matrix has to be dissolved. With the division and order of the methods for correction according to the invention the calculational effort is reduced to the solution of two independent equation systems each having a 3×3-matrix and the rounding error is minimized. At the solution of the system of equations having the 3×3-matrix for the determination of the DC-offset an auxiliary value (H) is left being proportional to the signal power.

This is a further advantage of the procedure, since without special additional measure the signal power can be determined, which is an indispensable size in modern communication devices.

An example for the method for the correction of the DC-offset is shown in the FIG. 2 and is described in the following:

The set-up for the arrangement of the matrix (equation 2) for the implementation of a linear regression is an universally valid equation of a circle (equation 3) and their transformation (equation 4).

$$r^2 = (Q-Qm)^2 + (I-Im)^2 \tag{3}$$

$$0 = Q^2 + I^2 - 2 \cdot Q \cdot Qm - 2 \cdot I \cdot Im + H \tag{4}$$

The sums will be calculated respective from I samples of a pair of signals, whereby the samples are taken from a coherent time interval, in that a change of the parameters to be determined appears to be neglectable small.

The DC-offset is characterized by the center point Qm and Im of the circle. With the auxiliary variable H the signal power, the Radio-Signal-Strength-lndicator RSSI, can be determined through the equation 5.

$$RSSI = Qm + Im - H \tag{5}$$

In the FIG. 2 is further shown, how the DC-offset is removed by the subtraction of the correction values Im and Qm from the measured I- and Q-signals. This corresponds to the displacement of the center point of the ellipse into the origin of the Cartesian I-, Q-plane.

The subsequent compensation of the ellipticity is simplified by the fact, that the center point of the ellipse is situated in the origin of the coordinates.

An example for the method according to the invention for the correction of the ellipticity is shown in FIG. 3 and will be described in the following:

The set-up for the arrangement of the matrix (equation 1) for the implementation of the linear regression is an equation of a circle centered in the origin (equation 6) and its transformation (equation 7). The Q-signal will be kept as a reference signal.

The I'-signal being set perpendicular to the Q'-signal in equation 6 is substituted by the measure I'- and Q'-signals, so that the amplitude ratio a and the phase error δ is inserted into the system of equations. An corresponding set-up under retention of the I-signals as a reference signal is equally good.

$$0 = Q'^2 + \left( \frac{I' - \alpha \cdot Q' \cdot \sin(\delta)}{\alpha \cdot \cos(\delta)} \right)^2 - r^2 \tag{7}$$

The sums are calculated respective from K samples of a pair of signals, whereby the samples are taken from a coherent time interval, in that a change of the parameters to be determined appears to be neglectable small.

With the lower vector element of equation (2) the signal power, the Radio-Signal-Strength-Indicator RSSI ($r^2$), can be determined.

I claim:

1. A method for the correction of the amplitude α and phase error δ between signal-pairs which comprise inphase signal (I) and quadrature signal (Q) which represent vectors, and in which the values for correction are determined by calculating most probable correction values of offsets from a center point of the signal-pairs using signal probes $I'_k$ from the signal stream of the inphase signal (I) and signal probes $(Q'_k)$ from the signal stream of the quadrature signal (Q) followed by calculating corrections of the signals as a function of said calculated most probable values, the method comprising the steps of correcting the offsets from said center point, and calculating and correcting the amplitude α and the phase δ as a function of said signal probes $I'_k$ and $Q'_k$ only after a preceding correction of the offsets from the center point.

2. Method as claimed in claim 1, characterized in that the amplitude error α and the phase error δ are calculated by means of the matrix equation $$\begin{bmatrix} \alpha^2 \\ -2 \cdot \alpha \cdot \sin(\delta) \\ -r^2 \cdot \delta^2 \cdot \cos^2(\delta) \end{bmatrix} = \begin{bmatrix} \sum_{k=1}^{p} (Q'_k)^4 & \sum_{k=1}^{p} I'_k \cdot (Q'_k)^3 & \sum_{k=1}^{p} (Q'_k)^2 \\ \sum_{k=1}^{p} I'_k \cdot (Q'_k)^3 & \sum_{k=1}^{p} (I'_k)^2 \cdot (Q'_k)^2 & \sum_{k=1}^{p} I'_k \cdot Q'_k \\ \sum_{k=1}^{p} (Q'_k)^2 & \sum_{k=1}^{p} I'_k \cdot Q'_k & p \end{bmatrix}^{-1} \cdot$$

-continued $$\begin{bmatrix} -\sum_{k=1}^{p} (I'_k)^2 \cdot (Q'_k)^2 \\ -\sum_{k=1}^{p} (I'_k)^3 \cdot Q'_k \\ -\sum_{k=1}^{p} (I'_k)^2 \end{bmatrix},$$

whereby r is the radius of the circle formed by the signal probes $I'_k$ and $Q'_k$ represented as vectors and p is the number of signal probes taken from the signal stream for calculation of the matrix equation, and whereby at least three signal probes $Q'_k$ and $I'_k$ are taken from the signal stream.

3. A method as in claim 1 or 2 characterized in that the correction values of the offset of the center point are calculated as a function of signal probes $I_I$ from the uncorrected signal stream of the inphase signal (I) and signal probes $Q_I$ from the uncorrected signal stream of the quadrature signal (Q) by means of the matrix equation $$\begin{bmatrix} Qm \\ Im \\ H \end{bmatrix} = \quad (2)$$

$$\begin{bmatrix} 2\sum_{I=1}^{n} (Q_I)^2 & 2\sum_{I=1}^{n} (I_I \cdot Q_I) & -\sum_{I=1}^{n} Q_I \\ 2\sum_{I=1}^{n} (I_I \cdot Q_I) & 2\sum_{I=1}^{n} (I_I)^2 & -\sum_{I=1}^{n} I_I \\ -2\sum_{I=1}^{n} Q_I & -2\sum_{I=1}^{n} I_I & n \end{bmatrix}^{-1} \cdot$$

$$\begin{bmatrix} -\sum_{I=1}^{n} [(Q_I)^3 + (I_I)^2 \cdot Q_I] \\ -\sum_{I=1}^{n} [I_I \cdot (Q_I)^2 + (I_I)^3] \\ \sum_{I=1}^{n} [(Q_I)^2 + (I_I)^2] \end{bmatrix}$$

whereby H is a value which is proportional to the signal power and n is the number of signal probes taken from the signal stream for calculation of the matrix equation, and whereby at least three signal probes $Q_I$ and $I_I$ are taken from the signal stream.

4. A method as in claim 1 and further comprising the step of providing said inphase signal (L) and quadrature signal (Q) from a homodyne receiver.

5. Apparatus for the correction of signal-pairs of, which are as inphase (I) and quadratur signals (Q) representable as vectors, comprising an arithmetic unit (8) for calculation and correction of the offset of the center point and an arithmetic unit (9) for calculation and correction of the amplitude error $\alpha$ as well as of the phase error $\delta$ by means of a calculation of most probably values using signal probes $I'_k$ from the signal stream of the inphase signal (I) and signal probes $Q'_k$ from the signal stream of the quadrature signal (Q), characterized in that the arithmetic unit (8) for calculation and correction of the offset of the center point is arranged in front of the arithmetic unit (9) for correction of the amplitude $\alpha$ and the phase error $\delta$, and that the calculation of the amplitude $\alpha$ and the phase error $\delta$ is carried out using signal probes $I'_k$ and $Q'_k$, which are already center point corrected.

6. Apparatus as claimed in claim 5, characterized in that the arithmetic unit (10) is suited for calculation of the amplitude error $\alpha$ by means of the matrix equation $$\begin{bmatrix} \alpha^2 \\ -2 \cdot \alpha \cdot \sin(\delta) \\ -r^2 \cdot \delta^2 \cdot \cos^2(\delta) \end{bmatrix} =$$

$$\begin{bmatrix} \sum_{k=1}^{p} (Q_k)^4 & \sum_{k=1}^{p} I_k \cdot (Q_k)^3 & \sum_{k=1}^{p} (Q_k)^2 \\ \sum_{k=1}^{p} I_k \cdot (Q_k)^3 & \sum_{k=1}^{p} (I_k)^2 \cdot (Q_k)^2 & \sum_{k=1}^{p} I_k \cdot Q_k \\ \sum_{k=1}^{p} (Q_k)^2 & \sum_{k=1}^{p} I_k \cdot Q_k & p \end{bmatrix}^{-1} \cdot$$

$$\begin{bmatrix} -\sum_{k=1}^{p} (I_k)^2 \cdot (Q_k)^2 \\ -\sum_{k=1}^{p} (I_k)^3 \cdot Q_k \\ -\sum_{k=1}^{p} (I_k)^2 \end{bmatrix},$$

whereby r is the radius of the circle formed by the signal probes $I'_k$ and $Q'_k$ represented as vectors and p is the number of signal probes taken from the signal stream for calculation of the matrix equation, and whereby at least respective three signal probes $Q'_k$ and $I'_k$ are taken from the signal stream.

7. Apparatus as claimed in claim 5 or 6, characterized in that the arithmetic unit for calculation of the values for correction Im und Qm of the center point offset (8) using signal probes $I_I$ from the uncorrected signal stream of the inphase signal (I) and signal probes $Q_I$ from the uncorrected signal stream of the quadrature signal (Q) is distincted by means of the matrix equation $$\begin{bmatrix} Qm \\ Im \\ H \end{bmatrix} =$$

$$\begin{bmatrix} 2\sum_{I=1}^{n} (Q_I)^2 & 2\sum_{I=1}^{n} (I_I \cdot Q_I) & -\sum_{I=1}^{n} Q_I \\ 2\sum_{I=1}^{n} (I_I \cdot Q_I) & 2\sum_{I=1}^{n} (I_I)^2 & -\sum_{I=1}^{n} I_I \\ -2\sum_{I=1}^{n} Q_I & -2\sum_{I=1}^{n} I_I & n \end{bmatrix}^{-1} \cdot$$

$$\begin{bmatrix} -\sum_{I=1}^{n} [(Q_I)^3 + (I_I)^2 \cdot Q_I] \\ -\sum_{I=1}^{n} [I_I \cdot (Q_I)^2 + (I_I)^3] \\ \sum_{I=1}^{n} [(Q_I)^2 + (I_I)^2] \end{bmatrix}$$

whereby H is a value being proportional to the signal power and n is the number of signal probes taken from the signal stream for calculation of the matrix equation, and whereby at least respective three signal probes $Q_I$ and $I_I$ are taken from the signal stream.

8. Apparatus as claimed in claim 7, characterized in that the arithmetic unit for calculation of the values for correction Im und Qm of the center point offset (8) is suited for the output of a value H being proportional to the signal power.

9. Apparatus as claimed in claim 8 for the correction of the signal of a homodyne receiver.

10. Apparatus as claimed in claim 7 for the correction of the signal of a homodyne receiver.

11. Apparatus as claimed in one of the claims 5 or 6 for the correction of the signal of a homodyne receiver.

* * * * *